United States Patent
Ye (10) Patent No.: US 11,768,556 B2
(45) Date of Patent: Sep. 26, 2023

(54) TOUCH DISPLAY DEVICE AND TOUCH DRIVING METHOD OF SAME

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 350 days.

(21) Appl. No.: 15/734,251

(22) PCT Filed: Aug. 26, 2020

(86) PCT No.: PCT/CN2020/111325
§ 371 (c)(1),
(2) Date: Dec. 2, 2020

(87) PCT Pub. No.: WO2021/258527
PCT Pub. Date: Dec. 30, 2021

(65) Prior Publication Data
US 2021/0397323 A1    Dec. 23, 2021

(30) Foreign Application Priority Data
Jun. 23, 2020 (CN) .......................... 202010577915.4

(51) Int. Cl.
*G06F 3/041* (2006.01)
*G06F 3/044* (2006.01)
*H03K 17/96* (2006.01)

(52) U.S. Cl.
CPC ........ *G06F 3/04166* (2019.05); *G06F 3/0443* (2019.05); *G06F 3/04164* (2019.05); *H03K 17/962* (2013.01); *H03K 2017/9604* (2013.01)

(58) Field of Classification Search
None
See application file for complete search history.

(56) References Cited

U.S. PATENT DOCUMENTS

| | | | |
|---|---|---|---|
| 2008/0158167 A1* | 7/2008 | Hotelling | .......... G06F 3/041661 345/173 |
| 2011/0084857 A1 | 4/2011 | Marino et al. | |
| 2016/0224164 A1* | 8/2016 | Huang | .................... G06F 3/044 |

(Continued)

FOREIGN PATENT DOCUMENTS

| | | |
|---|---|---|
| CN | 102576272 A | 7/2012 |
| CN | 105446547 A | 3/2016 |

(Continued)

*Primary Examiner* — Krishna P Neupane
(74) *Attorney, Agent, or Firm* — The Roy Gross Law Firm, LLC; Roy Gross (57) ABSTRACT

A touch display device and a touch driving method are provided. The touch display device comprises a plurality of interlaced sensing electrodes and driving electrodes in N large groups. Corresponding driving signals synchronously scan the driving electrodes of each large group. Scanning time of the driving electrodes can be reduced to an original 1/N, which can improve a touch report rate.

20 Claims, 8 Drawing Sheets

(56) References Cited

U.S. PATENT DOCUMENTS

2017/0102798 A1    4/2017  Qiao
2019/0138148 A1*   5/2019  Kwon .................. G06F 3/0446
2020/0319737 A1   10/2020  Leigh et al.

FOREIGN PATENT DOCUMENTS

| CN | 105589597 | A  | 5/2016 |
| CN | 108139830 | A  | 6/2018 |
| CN | 110007812 | A  | 7/2019 |
| CN | 111475058 | A  | 7/2020 |
| EP |   2615530 | A2 | 7/2013 |

* cited by examiner

TOUCH DISPLAY DEVICE AND TOUCH DRIVING METHOD OF SAME

FIELD OF INVENTION

The present application relates to the field of touch display technologies, and in particular to the field of touch driving technologies, and in particular to a touch display device and a touch driving method.

BACKGROUND OF INVENTION

In mutual capacitive touch display screens of conventional technical solutions, a low report rate will lead to missing report when clicking quickly, or a scribe will not be smooth during a spiral test, which seriously affects user's touch experience.

SUMMARY OF INVENTION

The present application provides a touch display device and a touch driving method, which solves an issue of low report rate of touch display.

In a first aspect, the present application provides a touch display device comprising a plurality of interlaced sensing electrodes and driving electrodes located in N large groups; wherein the driving electrodes in a same large group carry driving signals with a same first characteristic, and the driving electrodes in different large groups carry driving signals with different first characteristics; corresponding driving signals synchronously scan the driving electrodes in each of the large groups; sensing signals in the sensing electrodes are received for positioning touch positions; wherein N is an integer not less than 2.

Based on the first aspect, in a first implementation manner of the first aspect, the driving electrodes of each of the large groups are configured as driving electrodes of a plurality of small groups; the driving electrodes of each of the small groups carry driving signals with the same first characteristic but different second characteristics to simultaneously scan a same small group of driving electrodes; wherein the first characteristic is different from the second characteristic.

Based on the first implementation manner of the first aspect, in a second implementation manner of the first aspect, a number of driving electrodes of each small group is M; in the driving electrodes of each large group, a number of driving electrodes of at least one large group is not greater than M; wherein M is an integer not less than 2.

Based on the second implementation manner of the first aspect, in a third implementation manner of the first aspect, the corresponding driving signals continuously scan the driving electrodes of the same group at a fixed number of times.

Based on the first aspect, in a fourth implementation manner of the first aspect, difference of the first characteristics between driving signals in two adjacent large groups is a fixed fundamental frequency interval value.

Based on the first aspect, in a fifth implementation manner of the first aspect, a number of the small groups in each of the large groups is same.

Based on the fifth implementation manner of the first aspect, in a sixth implementation manner of the first aspect, a number of driving electrodes in each of the large groups is same.

Based on the first aspect, in a seventh implementation manner of the first aspect, the touch display device further comprises a touch controller. The touch controller is connected to the driving electrodes and the sensing electrodes and is configured to provide corresponding driving signals to the driving electrodes and receive sensing signals in the sensing electrodes to locate the touch positions. The touch controller comprises a filter. The filter is configured to correspondingly separate the sensing signals of a single frequency from the sensing signals of a mixed frequency to locate the touch positions respectively.

Based on the seventh implementation manner of the first aspect, in an eighth implementation manner of the first aspect, the driving signal is a square wave signal or a sine wave signal.

Further, the first characteristic is frequency, and the second characteristic is phase.

Optionally, the driving electrodes of each of the large groups or the small groups are adjacent and/or spaced apart.

In a second aspect, the present application provides a touch driving method of a touch display device. The touch display device comprises a touch controller, sensing electrodes, and N large groups of driving electrodes. The touch driving method comprises: synchronously outputting, by the touch controller, driving signals with different frequencies to the driving electrodes corresponding to the large group; simultaneously receiving, by the touch controller, the sensing signals mixed with frequencies in the sensing electrodes; and calculating and reporting, by the touch controller, touch coordinates according to the frequencies and changes of the sensing signals; wherein N is an integer not less than 2.

Beneficial Effect

In the touch display device and touch driving method provided in the present application, the corresponding driving signals synchronously scan the driving electrodes of each large group. Scanning time of the driving electrodes can be reduced to an original 1/N, which can improve a touch report rate.

DETAILED DESCRIPTION OF PREFERRED EMBODIMENTS

In order to make the purpose, technical solutions, and effects of the present application clearer, the following further describes the present application in detail with reference to the drawings and embodiments. It should be understood that the specific embodiments described herein are only used to explain the present application, and not used to limit the present application.

Figure 2:
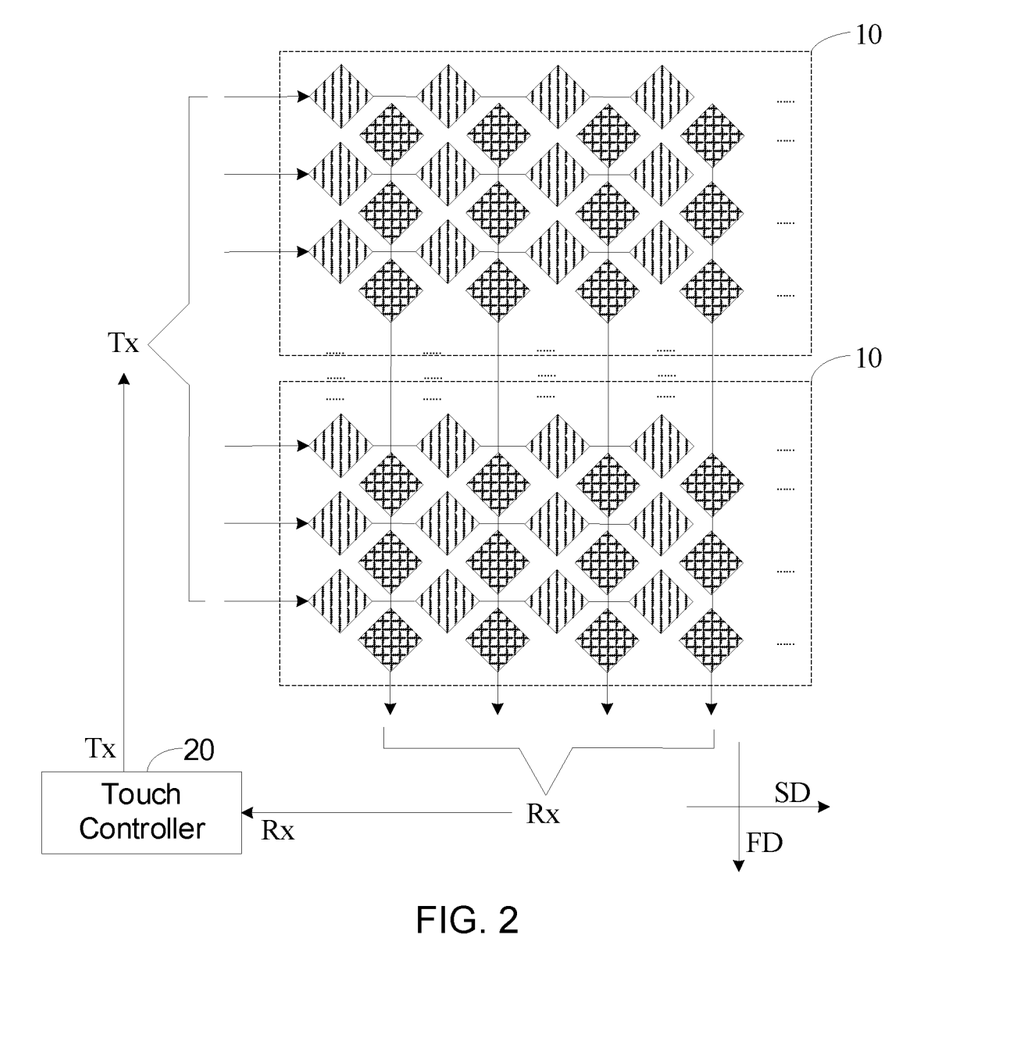
FIG. 2 is a schematic structural diagram of a touch display device/touch driving method provided by an embodiment of the present application.

An embodiment provides a touch driving method of a touch display device. The touch display device shown in FIG. 2 is provided with a plurality of interlaced sensing electrodes Rx and driving electrodes Tx located in N large groups 10. The driving method can include the following.

The driving signals of different frequencies are allocated to the driving electrodes Tx of the corresponding large group 10. It can be understood that the driving electrodes Tx in each large group 10 carry driving signals of the same frequency. The driving electrodes Tx in different large groups 10 carry driving signals of different frequencies. This facilitates identification or positioning of the large group 10 where the driving electrodes Tx are located according to the frequencies.

The driving electrodes Tx of each large group 10 are correspondingly connected to driving signals arranged in the same phase. It should be noted that the same phase arrangement, that is, the driving electrodes Tx of each large group 10 are connected to corresponding driving signals in a certain order, and the corresponding driving signals have corresponding phases. Each large group has driving signals with multiple phases, and the arrangement of these driving signals in phase is the phase arrangement. The phase arrangement of the driving signals in each large group is the same, indicating that the driving electrodes Tx in each large group are correspondingly connected to driving signals at the same time sequence. This can shorten scanning time of the driving electrodes Tx to 1/N of the previous one. Correspondingly, a report rate can be significantly improved.

The sensing signals in the sensing electrodes Rx are received to locate touch positions. It can be understood that when all the driving electrodes Tx are scanned, the sensing signals in the sensing electrodes Rx will be received once to determine the specific position of the touch, forming coordinate data and reporting it.

N is an integer not less than 2.

Figure 1:
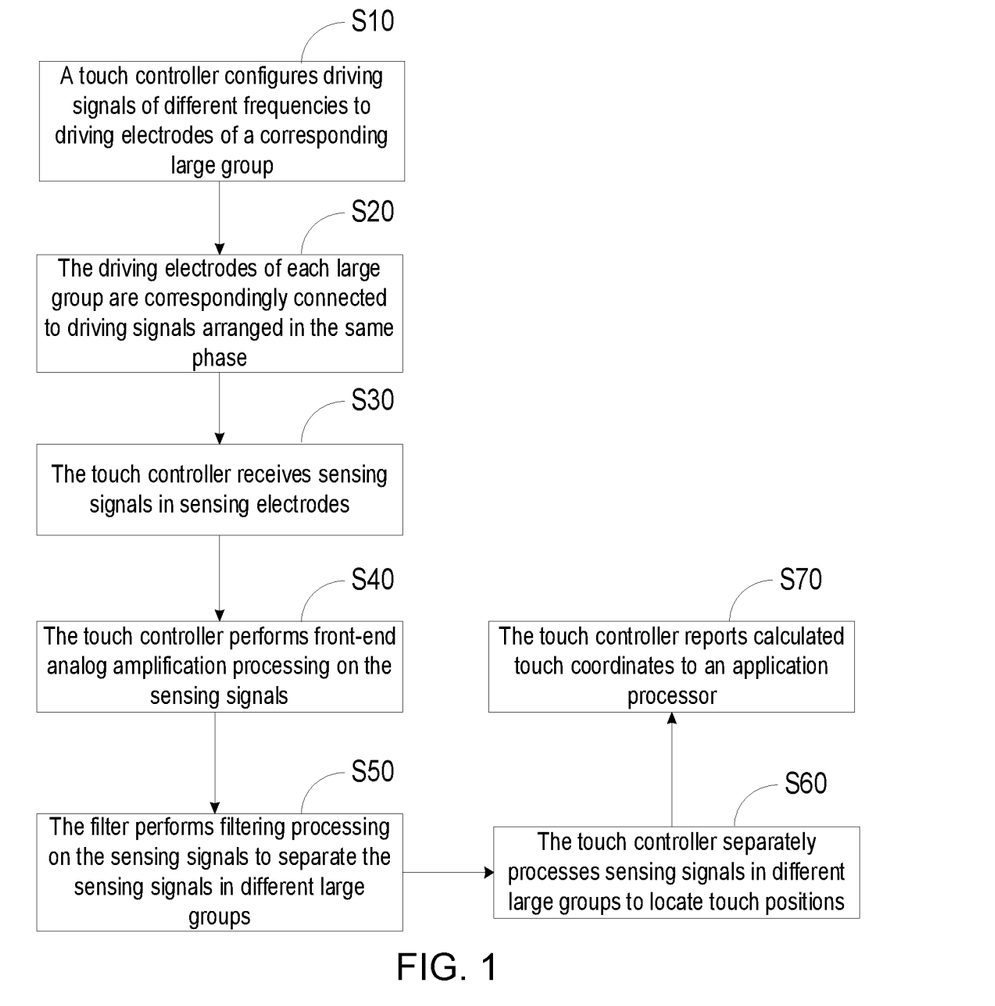
FIG. 1 is a schematic diagram of a working flow of a touch display device provided by an embodiment of the present application.
Figure 3:
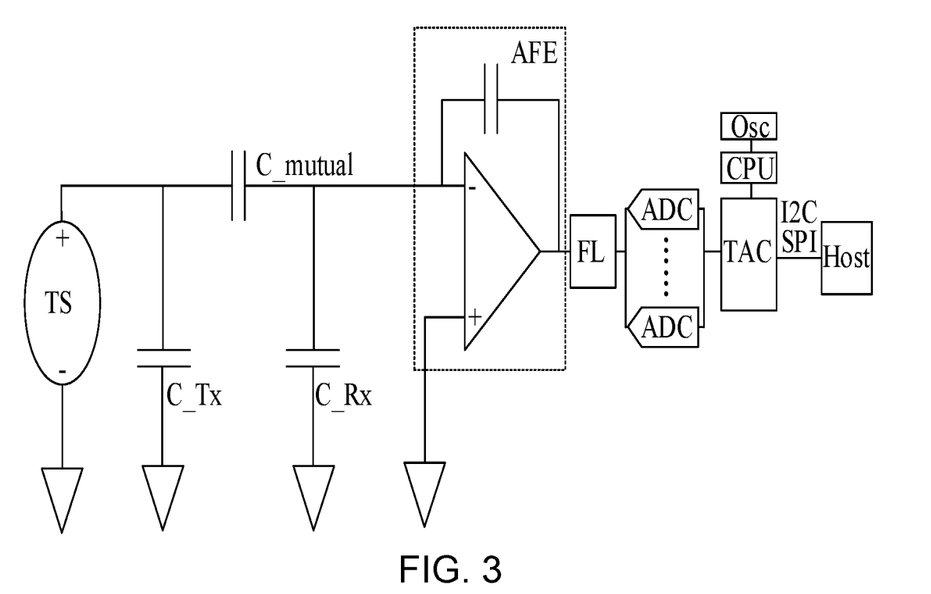
FIG. 3 is a diagram of an exemplary equivalent circuit model provided by an embodiment of the present application.

As shown in FIG. 1 and/or FIG. 3, a working flow of a touch display device provided by the present application includes the following steps. Step S10: A touch controller 20 configures driving signals of different frequencies to driving electrodes Tx of a corresponding large group 10.

Step S20: The driving electrodes Tx of each large group 10 are correspondingly connected to driving signals arranged in the same phase.

Step S30: The touch controller 20 receives sensing signals in sensing electrodes Rx.

Step S40: The touch controller 20 performs front-end analog amplification processing on the sensing signals.

Step S50: The filter FL performs filtering processing on the sensing signals to separate the sensing signals in different large groups 10.

Step S60: The touch controller 20 separately processes the sensing signals in different large groups 10 to locate touch positions.

Step S70: The touch controller 20 reports calculated touch coordinates to an application processor HOST.

In one of embodiments, the driving electrodes Tx located in each large group 10 are configured as driving electrodes Tx of multiple small groups. Each small group of driving electrodes Tx corresponds to driving signals of the same phase. The driving electrodes Tx of each large group 10 are in small groups and scanned by corresponding driving signals at the same timing. It is understandable that each large group 10 is scanned at the same time sequence in a small group. That is, in each large group 10, start scanning the driving electrodes Tx in the first group at the same time, and then scan the driving electrodes Tx in the second group, and so on, until all driving electrodes Tx are scanned by the corresponding driving signals. Therefore, each large group 10 is scanned at the same timing. This step can shorten the scanning time to 1/N of that before the large group 10. Correspondingly, the report rate can be significantly improved. The report rate refers to the number of times the touch controller 20 reports coordinates in a unit time. It is mainly determined by the time for the touch controller 20 to scan the channels formed by all driving electrodes Tx, which is proportional to its scanning speed and inversely proportional to the number of channels. For example, it takes 20 ms to scan all channels. The 1 s or 1000 ms can scan 50 times, and the report rate at this time is about 50.

The corresponding driving signals simultaneously scan the driving electrodes Tx in the same small group. It is understandable that this step means that all the driving electrodes Tx in each small group are simultaneously scanned by the driving signals. This can save scanning time and also increase the report rate.

In summary, as shown in FIG. 2, in one of the embodiments, the present application provides a touch display device. The touch display device is provided with a plurality of interlaced sensing electrodes Rx and driving electrodes Tx located in N large groups 10. The driving electrodes Tx of the same large group 10 carry driving signals of the same first characteristic, and the driving electrodes Tx of different large groups 10 carry driving signals with different first characteristics. The corresponding driving signals synchronously scan the driving electrodes Tx of each large group 10, and the sensing signals in the sensing electrodes Rx are received to locate touch positions. N is an integer not less than 2.

It should be noted that the first characteristic may, but is not limited to, the frequency of the driving signal. The second characteristic can be, but is not limited to, the phase of the driving signal.

It is understandable that the corresponding driving signals synchronously scan the driving electrodes Tx of each large group 10, and the scanning time of the driving electrodes Tx can be reduced to 1/N of the original, which can improve touch report rate.

In one of the embodiments, the driving electrodes Tx of each large group 10 are configured as multiple small groups of driving electrodes Tx. The driving electrodes Tx of each small group carry driving signals with the same first characteristic and different second characteristics to scan the driving electrodes Tx of the same small group at the same time. The first characteristic is different from the second characteristic.

It is understandable that by scanning the driving electrodes Tx of the same small group at the same time, the scanning time can be reduced to improve the touch report rate.

In one of the embodiments, the number of driving electrodes Tx in each small group is M. The number of driving electrodes Tx in at least one small group in each large group 10 is not more than M. That is, in other words, when the number of driving electrodes Tx in the large group 10 is not enough to be evenly distributed to the corresponding small groups, there will always be a small group of different driving electrodes Tx from other small groups. M is an integer not less than 2.

In one of the embodiments, the corresponding driving signals continuously scan the driving electrodes Tx in the same small group at a fixed number of times. Specifically, the fixed number of times may be but not limited to M, that is, the fixed number of times is related to the number of driving electrodes Tx in each small group. For example, in each large group 10, after the driving electrodes Tx in the first small group are continuously scanned M times, then the driving electrodes Tx in the second small group are continuously scanned M times, and so on. It can be understood that the fixed number of times may also be other integers, for example, 1, or 2, or 3, or 4, etc.

In one of the embodiments, the difference in the first characteristic of the driving signals in the adjacent large groups 10 is a fixed fundamental frequency interval value. For example, the fixed base frequency interval value may be but not limited to 20 KHz.

In one of the embodiments, the number of small groups in each large group 10 may be, but not limited to, the same or not.

In one of the embodiments, the number of driving electrodes Tx in each large group 10 may be, but not limited to, the same or different.

In one of the embodiments, a filter FL is also included. The filter FL performs filtering detection on the received sensing signals of the mixed frequency to obtain the sensing signal of the corresponding frequency. The filter FL recognizes the corresponding sensing electrodes Rx and the driving electrodes Tx mutually compatible with the sensing electrodes Rx according to the frequency.

In one of the embodiments, the driving signal is a square wave signal or a sine wave signal.

As shown in FIG. 2, in one of the embodiments, the present application provides a touch display device, which includes a plurality of driving electrodes Tx arranged along a first direction FD and located in N large groups 10, a plurality of sensing electrodes Rx arranged along a second direction SD are correspondingly staggered with the driving electrodes Tx, and a touch controller 20 connected to the driving electrodes Tx and the sensing electrodes Rx and configured to provide corresponding driving signals to the driving electrodes Tx and receive sensing signals in the sensing electrodes Rx to locate touch positions. The driving electrodes Tx of the same large group 10 carry driving signals of the same first characteristic, and the driving electrodes Tx of different large groups 10 carry driving signals of different first characteristics. The corresponding driving signals synchronously scan the driving electrodes Tx of each large group 10. N is an integer not less than 2.

It should be noted that the first direction FD is different from the second direction SD. Specifically, the first direction FD may be perpendicular to the second direction SD. The first direction FD may be a vertical direction or a horizontal direction. Correspondingly, the second direction SD is a horizontal direction or a vertical direction.

It can be understood that each driving electrode Tx in the present disclosure may include a plurality of first transparent electrodes connected in sequence. Each sensing electrode Rx may include a plurality of second transparent electrodes connected in sequence. Both the first transparent electrode and the second transparent electrode may be, but not limited to, a diamond shape, and may also be a strip shape or other shapes.

In one of the embodiments, the present application provides a touch driving method of a touch display device. The touch display device shown in FIG. 2 and/or FIG. 3 includes a touch controller 20, sensing electrodes Rx, and N large groups of driving electrodes Tx. The touch driving method shown in FIG. 8 includes the following steps.

Figure 8:
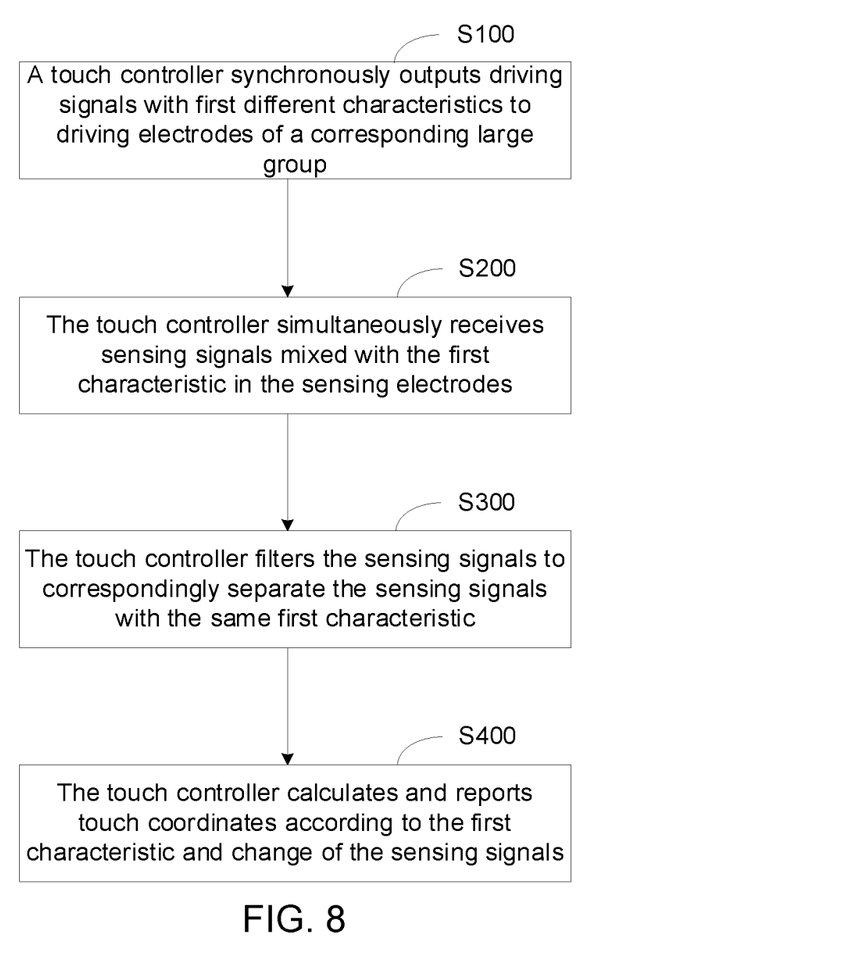
FIG. 8 is a schematic diagram of a touch driving method of a touch display device according to an embodiment of the present application.

Step S100: A touch controller 20 synchronously outputs driving signals with first different characteristics to driving electrodes Tx of a corresponding large group 10. It should be noted that the driving electrodes Tx of the same large group 10 carry driving signals of the same first characteristic, and the driving electrodes Tx of different large groups 10 carry driving signals of different first characteristics. The corresponding driving signals synchronously scan the driving electrodes Tx of each large group 10.

Step S200: The touch controller 20 simultaneously receives sensing signals mixed with the first characteristic in the sensing electrodes Rx.

Step S300: The touch controller 20 filters the sensing signals to correspondingly separate the sensing signals with the same first characteristic.

Step S400: The touch controller 20 calculates and reports touch coordinates according to the first characteristic and change of the sensing signals.

N is an integer not less than 2.

It can be understood that the touch controller 20 synchronously outputs driving signals with first different characteristics to the driving electrodes Tx corresponding to the large group 10. This can save the scanning time of the driving electrode Tx, thereby increasing its report rate.

In one of the embodiments, the mutual-capacitive touch screen may include driving electrodes Tx and sensing electrodes Rx. The driving electrodes Tx and the sensing electrodes Rx are vertically intersected to form a mutual capacitance. The driving principle and method mainly include driving signals successively into the channel formed by the driving electrodes Tx of the screen body for scanning, such as square wave signal or sine wave waveform signal. All the sensing electrodes Rx receive signals together.

When the finger touches a surface of the touch screen, the mutual capacitance induction between the driving electrodes Tx and the sensing electrodes Rx will be changed, thereby changing the signals received by the sensing electrodes Rx. The touch controller 20 determines the specific position of the touch by detecting change of the signals received by the sensing electrodes Rx and the number of channels corresponding to the driving signals in the driving electrodes Tx.

The channel sequential scanning mode of the driving electrode Tx of the touch screen mainly includes sequential scanning of a single channel and scanning of multiple channels in small groups. The report rate of the touch screen is determined by channel scanning time of the screen, data processing time of the touch controller 20 and coordinate calculation time. Since the data processing time and coordinate calculation time of the touch controller 20 are generally relatively short, a key factor that determines the report rate usually depends on the time required for scanning the channel of the driving electrode Tx of the touch screen body.

In conventional technical solutions, scanning waveform frequencies of all driving electrodes Tx of the touch screen body are a uniform fixed value. For example, the number of channels of the driving electrodes Tx of the touch screen is 20. From the first driving electrode Tx1 (not shown) channel to the twentieth driving electrode Tx20 channel, the waveform frequencies of all driving signals are, for example, 220 KHz.

The present application provides a high-report rate touch driving scheme and a touch display screen. The touch screen is a mutual capacitance touch screen including driving electrodes Tx and sensing electrodes Rx. In order to save scanning time of all driving channels of the touch screen, a scanning mode of the driving electrodes Tx of the touch screen adopts a mode of up and down or left and right, half-screen small-group dual-frequency synchronous scanning. This saves half of the scanning time, which is equivalent to only scanning half the screen for a waveform of one frequency.

When all the sensing electrodes Rx receive sensing signals together, a filter circuit is set inside the touch controller 20 at the same time. According to the filter circuit detecting the frequency of the waveform signal received by the sensing electrode Rx, it can correspond to the position of the driving electrode Tx channel of the upper half of the screen or the lower half of the screen.

Furthermore, in order to save the scanning time of all driving channels of the touch screen, the scanning mode of the driving electrodes Tx of the touch screen may also be up and down or left and right. Large group 10 of small-groups multi-frequency synchronous scanning mode. In this way, the entire touch screen body only needs 1/N scanning time. N is the number of large groups of the screen, such as 3 or greater than 3.

The entire touch screen body is divided into 3 areas, and the waveform scanning frequency corresponding to each area is 240 Khz, 260 Khz, and 280 Khz. Frequency data can be adjusted according to actual needs, not fixed values. There is a certain fundamental frequency interval between adjacent frequency values.

Correspondingly, when all the sensing electrodes Rx receive signals together, a filter detection circuit is provided inside the touch controller 20. According to the filter detection circuit detecting the frequency of the sensing signal received by the sensing electrode Rx, it can correspond to the driving signal of the driving electrode Tx channel of which large group 10 or area of the screen. After data processing and calculation by the touch controller 20, the touched position can be determined.

In response to the current requirements for high report rate touch screens, the present application provides a high report rate touch driving scheme and touch display screens, which can effectively save the scanning time of the driving electrodes Tx of the touch screen body, thereby effectively improving the report rate of the touch screen.

In order to save the scanning time of all driving channels of the touch screen, the scanning mode of the driving electrode Tx of the touch screen adopts the mode of up and down or left and right, half-screen sub-group dual-frequency synchronous scanning. This saves half of the scanning time, which is equivalent to only scanning half the screen for a waveform of one frequency.

The scanning mode of the driving electrodes Tx can be a scanning mode from top (bottom) to bottom (top), or a scanning mode from left (right) to right (left). This depends on whether the driving electrodes Tx are arranged horizontally or vertically.

For example, if the longitudinal channel is the driving electrode Tx, the scanning mode is from left (right) to right (left).

Figure 4:
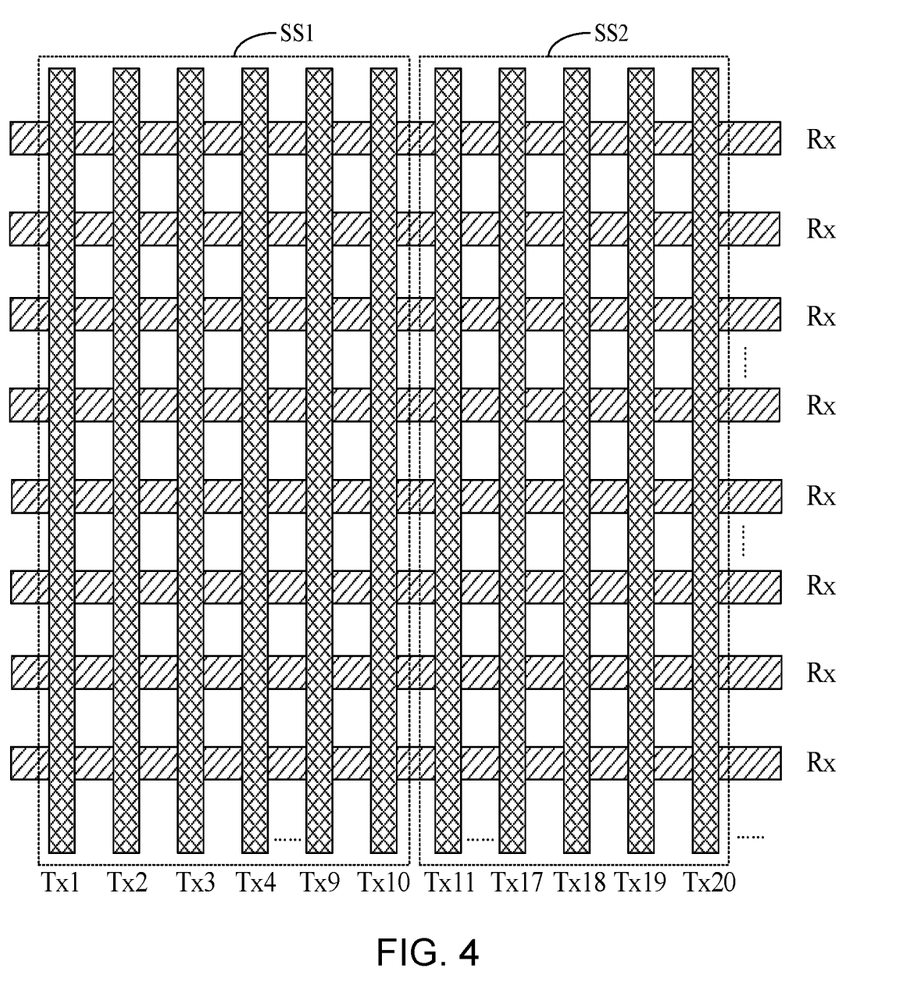
FIG. 4 is a schematic structural diagram of two large groups of a touch display device/touch driving method provided by an embodiment of the present application.

As shown in FIG. 4, in one of the embodiments, the touch screen includes 20 driving electrodes Tx. Correspondingly, 20 drive channels are formed. The first driving electrode Tx1 to the tenth driving electrode Tx10 are the left half of the screen. The scanning square wave frequency of the driving electrode Tx in the left half of the screen is 240 Khz. The eleventh drive electrode Tx11 to the twentieth drive electrode Tx20 are the right half of the screen. The scanning square wave frequency of the driving electrode Tx in the right half of the screen is 260 Khz.

As shown in FIG. 4, in the left half of the screen SS1, the small groups are as follows, the first driving electrode Tx1, the second driving electrode Tx2, the third driving electrode Tx3, and the fourth driving electrode Tx4 are a small group. Small group is used as a unit, the four channel electrodes are scanned 4 times at the same time. The fifth driving electrode Tx5 (not shown) to the eighth driving electrode Tx8 (not shown) are scanned 4 times subsequently. The remaining ninth driving electrodes Tx9 to the tenth driving electrodes Tx10 are a small group and scanned four times. Above, the electrode scanning of the driving electrodes Tx in the left half of the screen is completed.

In the same way, while performing electrode scanning on the driving electrodes Tx of the left half of the screen, for the driving electrodes Tx of the right half of the screen SS2, the eleventh driving electrode Tx11 to the fourteenth driving electrode Tx14 (not shown) are a small group, the fifteenth driving electrode Tx15 (not shown) to the seventeenth driving electrode Tx17 and the eighteenth driving electrode Tx18 are a small group, the remaining nineteenth driving electrodes Tx19 to the twentieth driving electrode Tx20 are a small group, a similar scanning method is also performed at the same time.

Figure 7:
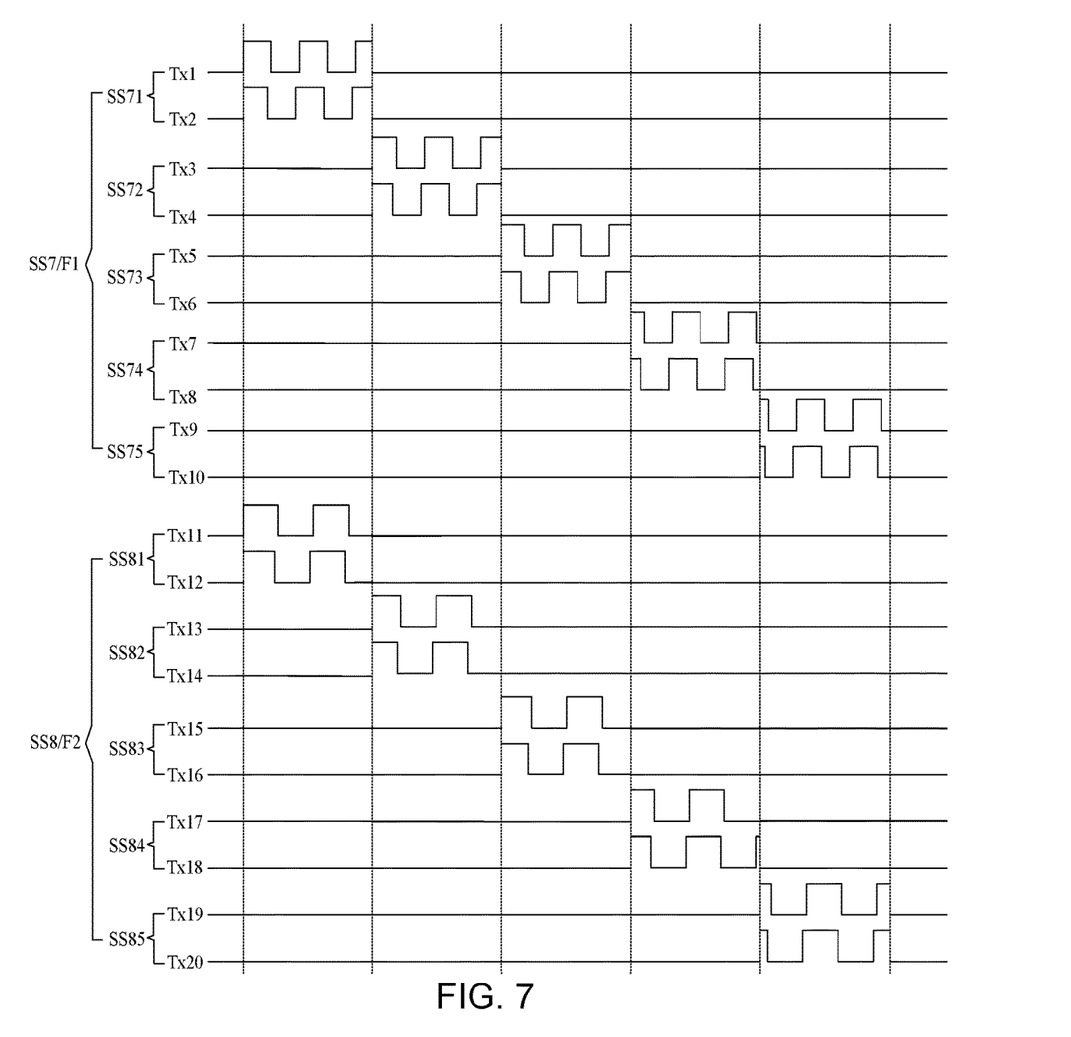
FIG. 7 is a schematic diagram of waveforms of driving signals in a touch display device provided by an embodiment of the present application.

As shown in FIG. 7, in one of the embodiments, the touch display device includes a first large group SS7 and a second large group SS8. The first large group SS7 includes a first small group SS71, a second small group SS72, a third small group SS73, a fourth small group SS74, and a fifth small group SS75. The second large group SS8 includes a sixth small group SS81, a seventh small group SS82, an eighth small group SS83, a ninth small group SS84, and a tenth small group SS85. The first small group SS71 includes a first driving electrode Tx1 and a second driving electrode Tx2. The second small group SS72 includes a third driving electrode Tx3 and a fourth driving electrode Tx4. The third small group SS73 includes a fifth driving electrode Tx5 and a sixth driving electrode Tx6. The fourth small group SS74 includes a seventh driving electrode Tx7 and an eighth driving electrode Tx8. The fifth small group SS75 includes a ninth driving electrode Tx9 and a tenth driving electrode Tx10. The sixth small group SS81 includes an eleventh driving electrode Tx11 and a twelfth driving electrode Tx12. The seventh small group SS82 includes a thirteenth driving electrode Tx13 and a fourteenth driving electrode Tx14. The eighth small group SS83 includes a fifteenth driving electrode Tx15 and a sixteenth driving electrode Tx16. The ninth small group SS84 includes a seventeenth driving electrode Tx17 and an eighteenth driving electrode Tx18. The tenth small group SS85 includes a nineteenth driving electrode Tx19 and a twentieth driving electrode Tx20.

It should be noted that when the touch display device is in operation, the driving signals corresponding to a first frequency F1 and a second frequency F2 in order synchronously scan the driving electrodes Tx of the first large group SS7 and the second large group SS8. That is: when the driving signals of the corresponding group scan the first small group SS71, the second small group SS72, the third small group SS73, the fourth small group SS74, and the fifth small group SS75 sequentially, the driving signals of the other corresponding group also scans the sixth small group SS81, the seventh small group SS82, the eighth small group SS83, the ninth small group SS84, and the tenth small group SS85 sequentially. Obviously, this can save the scanning time of the driving electrode Tx. In the same small group, each driving electrode carrier is scanned simultaneously with driving signals of different phases. For example, the first driving electrode Tx1 and the second driving electrode Tx2 in the first small group SS71 start to receive corresponding driving signals at the same time, but the driving signals in the first driving electrode Tx1 and the second driving electrode Tx2 have different phases.

It should be noted that the phase of the driving signal shown in FIG. 7 may be, but not limited to, change in sequence, and the phase of each driving signal may be different.

It should be noted that, in the figure, the number of square waves in each scan period is for illustration only, and not as a technical means to limit the present invention.

Correspondingly, when all the sensing electrodes Rx receive signals together, a filter detection circuit is provided inside the touch controller 20. According to the filter detection circuit detecting the frequency of the sensing signal received by the sensing electrode Rx, it can correspond to the driving signal of the driving electrode Tx channel of which large group 10 or area of the screen. After data processing and calculation by the touch controller 20, the touched position can be determined.

Furthermore, in order to save the scanning time of all driving channels of the touch screen, the scanning mode of the driving electrodes Tx of the touch screen may also be up and down or left and right. Large group 10 of small-groups multi-frequency synchronous scanning mode. In this way, the entire touch screen body only needs 1/N scanning time. N is the number of large groups of the screen, such as 3 or greater than 3. The entire touch screen body is divided into 3 areas, and the waveform scanning frequency corresponding to each area is 240 Khz, 260 Khz, and 280 Khz.

Figure 5:
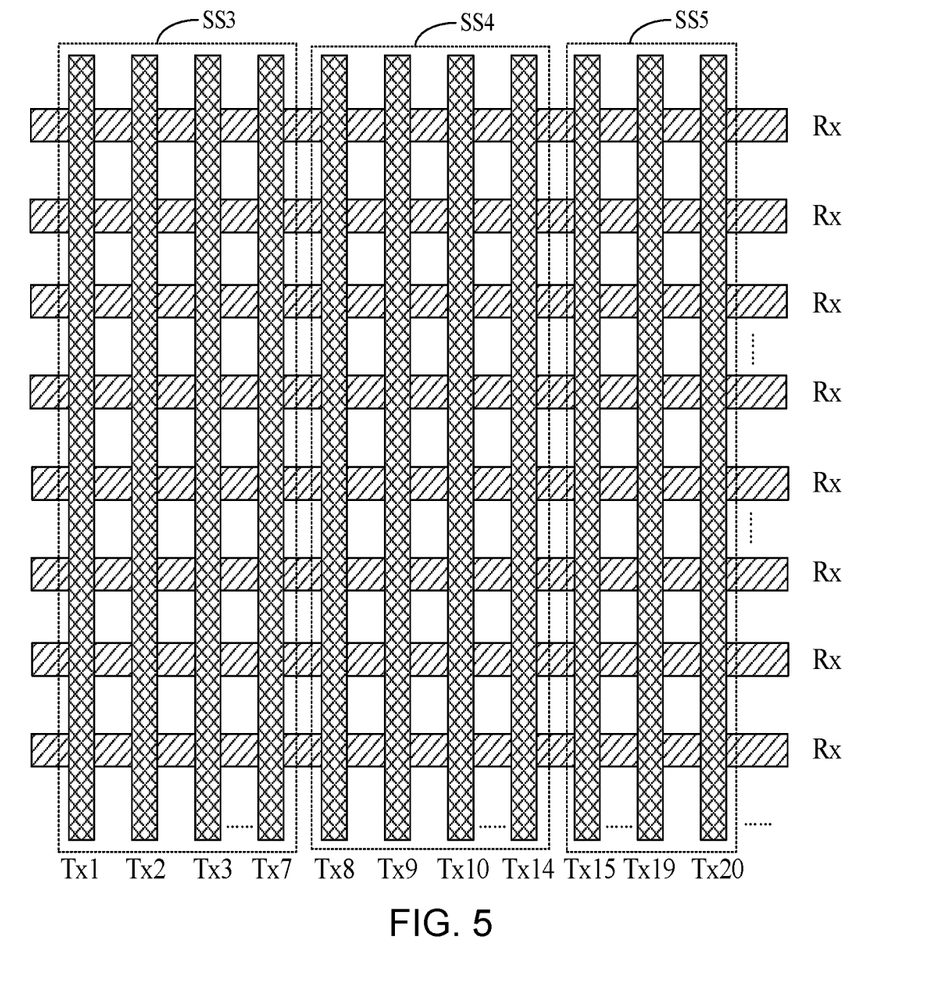
FIG. 5 is a first schematic structural diagram of three large groups of a touch display device/touch driving method provided by an embodiment of the present application.

As shown in FIG. 5, the touch screen includes 20 driving electrodes Tx, among which the first driving electrodes Tx1 to the seventh driving electrodes Tx7 are the first large group SS3, and the scanning square wave frequency of the driving electrodes Tx is 240 Khz. The eighth driving electrode Tx8 to the fourteenth driving electrode Tx14 are the second large group SS4, and the scanning square wave frequency of the driving electrode Tx is 260 Khz. The fifteenth driving electrode Tx15 to the twentieth driving electrode Tx20 are the third largest group SS5, and the scanning square wave frequency of the driving electrode Tx is 280 Khz.

As shown in FIG. 5, in the first large group SS3, the small groups are as follows, the first driving electrode Tx1, the second driving electrode Tx2, the third driving electrode Tx3, and the fourth driving electrode Tx4 (not shown) are a small group. Small group is used as a unit, the four channel electrodes are scanned 4 times at the same time. The fifth driving electrode Tx5 (not shown) to the seventh driving electrode Tx7 are then scanned 4 times. Above, the electrode scanning of the driving electrodes Tx of the first large group SS3 is completed. While scanning the first large group SS3, the electrode scanning of the driving electrodes Tx in the second large group SS4 and the third large group SS5 is completed in the same way of small-group scanning. Specifically, in the second large group SS4, the eighth driving electrode Tx8, the ninth driving electrode Tx9, the tenth driving electrode Tx10, and the eleventh driving electrode Tx11 (not shown) are a small group, and the small group is used as a unit. The four channel electrodes are scanned 4 times. The twelfth driving electrode Tx12 (not shown) to the fourteenth driving electrode Tx14 are scanned 4 times subsequently. Above, the electrode scanning of the driving electrodes Tx of the second large group SS4 is completed. In the third large group SS5, the fifteenth driving electrode Tx15 to the eighteenth driving electrode Tx18 (not shown) are a small group, and the four channel electrodes are scanned 4 times at the same time in a small group. The nineteenth driving electrode Tx19 to the twentieth driving electrode Tx20 are scanned 4 times subsequently. Above, the electrode scanning of the driving electrodes Tx of the third large group SS5 is completed.

Figure 6:
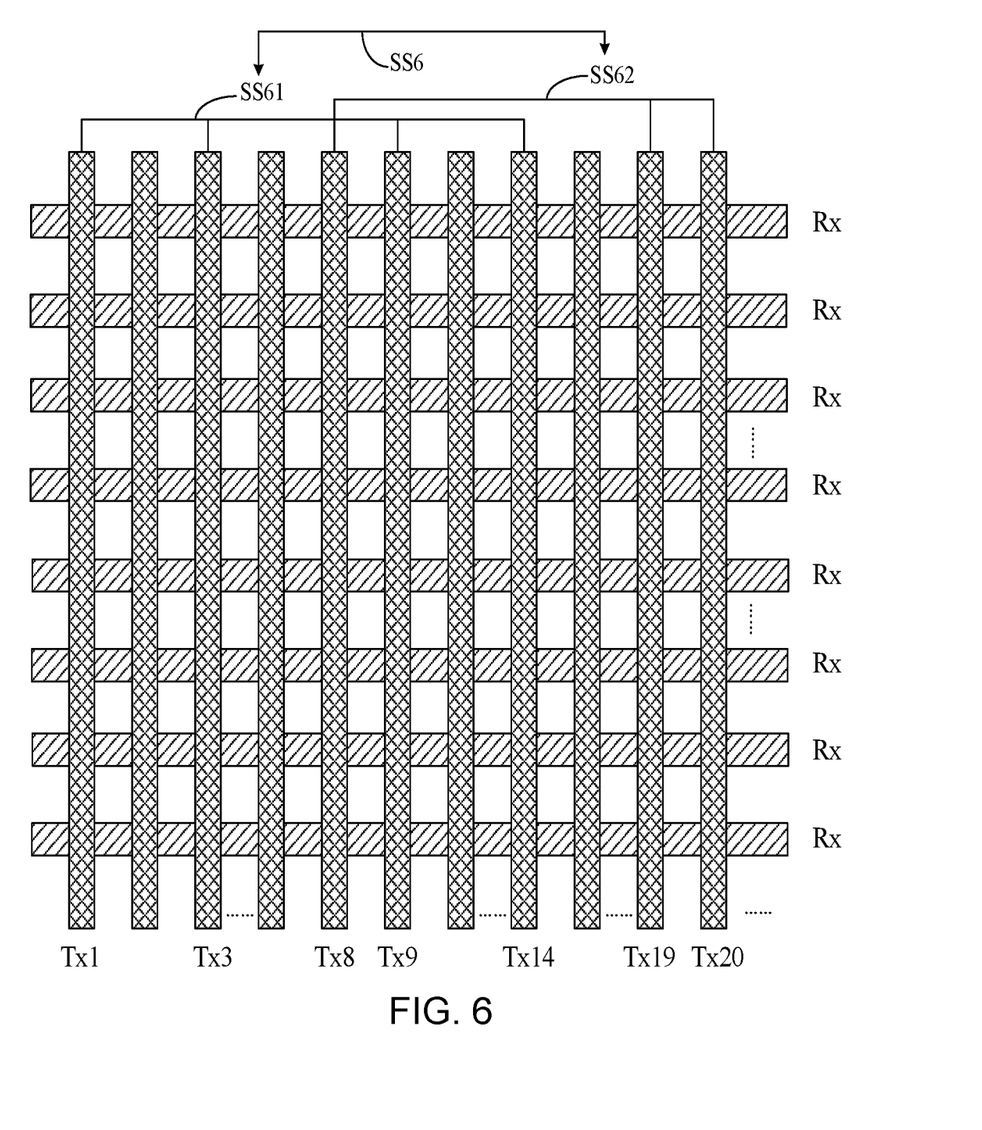
FIG. 6 is a second schematic structural diagram of three large groups of a touch display device/touch driving method provided by an embodiment of the present application.

In one of the embodiments, the driving electrodes Tx in each large group and/or small group may be, but not limited to, continuous or adjacent, and may also be scattered or spaced. For example, as shown in FIG. 6, the touch screen includes 20 driving electrodes Tx, which are divided into three large groups as an example. Any large group SS6 may include a first small group SS61 and a small second group SS62. The first small group SS61 includes spaced first driving electrode Tx1, third driving electrode Tx3, ninth driving electrode Tx9, and fourteenth driving electrode Tx14. The second small group SS62 may include an eighth driving electrode Tx8, a nineteenth driving electrode Tx19, and a twentieth driving electrode Tx20. It can be understood that the eighth driving electrode Tx8 is separated from the nineteenth driving electrode Tx19 and the twentieth driving electrode Tx20. The nineteenth driving electrode Tx19 and the twentieth driving electrode Tx20 are continuous or adjacent. The driving mode of large groups and/or small groups in this embodiment can still be adopted but not limited to those in other embodiments.

Correspondingly, when all the sensing electrodes Rx receive signals together, a filter detection circuit is provided inside the touch controller 20. According to the filter detection circuit detecting the frequency of the waveform signal received by the sensing electrode Rx, it can correspond to the scanning signal/driving signal of the driving electrode Tx channel of which area of the screen. After data processing and calculation by the touch controller 20, the touched position can be determined.

As shown in FIG. 3, in one of the embodiments, the present application provides an equivalent circuit model. A square wave signal TS of a certain frequency is output from the corresponding driving signal pin inside the touch controller 20, such as square wave 1: 240 KHz/0~6 v. The frequency of the waveform signal output by the touch controller 20 pins corresponding to the driving electrodes Tx in different groups 10 is different, such as square wave 2: 260 KHz/0~6 v, such as square wave 3: 280 KHz/0~6 v. The corresponding square wave signal is input to the corresponding driving electrode Tx in the touch screen. The node capacitance C_mutual between the driving electrode Tx and the sensing electrode Rx, the parasitic capacitance C_Tx of the driving electrode Tx to the zero potential GND, and the parasitic capacitance C_Rx of the sensing electrode Rx to the zero potential GNG are charged. The charge is stored in the integrating amplifier at the rear for integration operation.

The driving electrodes Tx in different large groups 10 input different waveform frequency signals. Therefore, the filter FL inside the touch controller 20 filters and differentiates the waveform signals passing through the integrating amplifier AFE (analog front end, used for analog electrical signal acquisition). The filtered and differentiated signal is converted into a corresponding digital signal by the corresponding analog-digital signal converter ADC (analog digital change). Finally, the central processing unit CPU inside the touch analog controller TAC performs digital processing and outputs digital signals. The touch controller 20 communicates with the host HOST through the I2C/SPI communication protocol and reports corresponding coordinate points.

The touch controller (touch IC) 20 is provided with a filter FL composed of a specific capacitance and resistance circuit. The filter FL is a narrow bandwidth filter, which can pass signals of a predetermined specific frequency component in the received signal, and greatly attenuate or suppress signals of other frequency components. Filtering the signal is the prerequisite and basis of signal processing. The main purpose of filtering is to filter out useless interference signals or signals that are not coherent with the target signal, and then obtain the signal required by the system. The filter FL is used to correspondingly separate the sensing signal of a single frequency from the induction signal of the mixed frequency, so as to respectively locate the position where the touch action occurs in each of the large groups 10.

The touch controller 20 internally filters the received analog electrical signals (specific voltage amplitude/certain frequency). It is the signal of a specific frequency that passes through the filter FL inside the touch IC to receive a large number of signals, including the target signal/various noise signals, and then intercept the desired part from these signals.

Furthermore, it can be recognized which large group 10 the corresponding sensing signal comes from, and the touch positioning of each large group 10 can be processed independently.

Generally, the analog signal obtained after the internal analog filtering of the touch IC is converted by the analog-to-digital converter ADC to obtain the digital signal, and after the digital filtering of the digital filter, the data required for calculating the touch coordinates of the internal target of the touch IC is obtained.

The core of digital filtering is the digital signal processor (DSP), and the DSP unit is set inside the touch IC. Digital filtering is an algorithm or device composed of digital multipliers, adders and other units to process the input discrete digital signal codes. Processing is to calculate in accordance with a pre-programmed program.

It is understandable that the touch screen is divided into N large groups 10, and the number of corresponding analog-digital signal converters ADC is also N. The central processing unit CPU can use the crystal oscillator Osc as the clock frequency.

It can be understood that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. A touch display device, comprising:
    a plurality of interlaced sensing electrodes and driving electrodes located in N large groups; wherein the driving electrodes in a same large group carry driving signals having a same frequency, and the driving electrodes in different large groups carry driving signals having different frequencies; corresponding driving signals synchronously scan the driving electrodes in each of the large groups; sensing signals in the sensing electrodes are received for positioning touch positions; and
    a touch controller, wherein a waveform signal of a fixed frequency is output from driving signal pins of the touch controller, the fixed frequency is 240 KHz, driving signal pins of the touch controller corresponding to the driving electrodes in different large groups output waveform signals having different frequencies, and the different frequencies are 260 Khz and 280 Khz;
    wherein N is an integer not less than 2;
    wherein a frequency difference between driving signals in two adjacent large groups is a fixed fundamental frequency interval value;
    wherein sensing signals of different groups have different frequencies and different phases, sensing signals of the same group have the same frequency and different phases, and the touch controller is configured to synchronously output the driving signals with different frequencies to a corresponding large group of driving electrodes.

2. The touch display device according to claim 1, wherein the driving electrodes of each of the large groups are configured as driving electrodes of a plurality of small groups; the driving electrodes of each of the small groups carry driving signals with a same frequency and different phases to simultaneously scan a same small group of driving electrodes.

3. The touch display device according to claim 2, wherein a number of driving electrodes of each small group is M; in the driving electrodes of each large group, a number of driving electrodes of at least one large group is not greater than M;
    wherein M is an integer not less than 2.

4. The touch display device according to claim 3, wherein the corresponding driving signals continuously scan the driving electrodes of the same group at a fixed number of times.

5. The touch display device according to claim 2, wherein a number of the small groups in each of the large groups is same.

6. The touch display device according to claim 5, wherein a number of driving electrodes in each of the large groups is same.

7. The touch display device according to claim 1, wherein the touch controller is connected to the driving electrodes and the sensing electrodes and is configured to provide corresponding driving signals to the driving electrodes and receive sensing signals in the sensing electrodes to locate the touch positions.

8. The touch display device according to claim 7, wherein the touch controller comprises a filter;
    wherein the filter is configured to correspondingly separate the sensing signals of a single frequency from the sensing signals of a mixed frequency to locate the touch positions respectively.

9. A touch display device, comprising:
    a plurality of interlaced sensing electrodes and driving electrodes located in N large groups; wherein the driving electrodes in a same large group carry driving signals having a same frequency, and the driving electrodes in different large groups carry driving signals having different frequencies; corresponding driving signals synchronously scan the driving electrodes in each of the large groups; sensing signals in the sensing electrodes are received for positioning touch positions; and
    a touch controller, wherein a waveform signal of a fixed frequency is output from driving signal pins of the touch controller, the fixed frequency is 240 KHz, driving signal pins of the touch controller corresponding to the driving electrodes in different large groups output waveform signals having different frequencies, and the different frequencies are 260 Khz and 280 Khz;
    wherein N is an integer not less than 2;
    wherein sensing signals of different groups have different frequencies and different phases, sensing signals of the same group have the same frequency and different phases, and the touch controller is configured to synchronously output the driving signals with different frequencies to a corresponding large group of driving electrodes.

10. The touch display device according to claim 9, the driving electrodes of each of the large groups are configured as driving electrodes of a plurality of small groups; the driving electrodes of each of the small groups carry driving signals with a same frequency and different phases to simultaneously scan a same small group of driving electrodes.

11. The touch display device according to claim 10, wherein a number of driving electrodes of each small group is M; in the driving electrodes of each large group, a number of driving electrodes of at least one large group is not greater than M;
wherein M is an integer not less than 2.

12. The touch display device according to claim 11, wherein the corresponding driving signals continuously scan the driving electrodes of the same group at a fixed number of times.

13. The touch display device according to claim 12, wherein the fixed number of times is M.

14. The touch display device according to claim 10, wherein a number of the small groups in each of the large groups is same.

15. The touch display device according to claim 14, wherein a number of driving electrodes in each of the large groups is same.

16. The touch display device according to claim 10, wherein the driving electrodes of each of the large groups or the small groups are adjacent and/or spaced apart.

17. The touch display device according to claim 9, wherein the touch controller is connected to the driving electrodes and the sensing electrodes and is configured to provide corresponding driving signals to the driving electrodes and receive sensing signals in the sensing electrodes to locate the touch positions.

18. The touch display device according to claim 17, wherein the touch controller comprises a filter;
wherein the filter is configured to correspondingly separate the sensing signals of a single frequency from the sensing signals of a mixed frequency to locate the touch positions respectively.

19. The touch display device according to claim 17, wherein the driving signal is a square wave signal or a sine wave signal.

20. A touch driving method of a touch display device, wherein the touch display device comprises a touch controller, sensing electrodes, and N large groups of driving electrodes; the touch driving method comprises:
synchronously outputting, by the touch controller, driving signals with different frequencies to the driving electrodes corresponding to the large group;
simultaneously receiving, by the touch controller, the sensing signals mixed with frequencies in the sensing electrodes; and
calculating and reporting, by the touch controller, touch coordinates according to the frequencies and changes of the sensing signals;
wherein a waveform signal of a fixed frequency is output from driving signal pins of the touch controller, the fixed frequency is 240 KHz, driving signal pins of the touch controller corresponding to the driving electrodes in different large groups output waveform signals having different frequencies, and the different frequencies are 260 Khz and 280 Khz;
wherein N is an integer not less than 2;
wherein sensing signals of different groups have different frequencies and different phases, sensing signals of the same group have the same frequency and different phases, and the touch controller is configured to synchronously output the driving signals with different frequencies to a corresponding large group of driving electrodes.

* * * * *